United States Patent
Co et al.

(10) Patent No.: US 7,960,992 B2
(45) Date of Patent: *Jun. 14, 2011

(54) CONVEYOR-BASED MEMORY-MODULE TESTER WITH ELEVATORS DISTRIBUTING MOVING TEST MOTHERBOARDS AMONG PARALLEL CONVEYORS FOR TESTING

(75) Inventors: Ramon S. Co, Trabuco Canyon, CA (US); Kevin J. Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 228 days.

This patent is subject to a terminal disclaimer.

(21) Appl. No.: 12/392,387

(22) Filed: Feb. 25, 2009

(65) Prior Publication Data

US 2010/0213027 A1    Aug. 26, 2010

(51) Int. Cl.
*G01R 31/20* (2006.01)
(52) U.S. Cl. .................................. 324/757.01
(58) Field of Classification Search .................. None
See application file for complete search history.

(56) References Cited

U.S. PATENT DOCUMENTS

| | | | |
|---|---|---|---|
| 3,593,862 A | | 7/1971 | Pierson et al. |
| 3,648,819 A | * | 3/1972 | Converse et al. .......... 198/346.1 |
| 4,940,935 A | | 7/1990 | Riley |
| 5,466,290 A | | 11/1995 | Berta |
| 5,894,217 A | | 4/1999 | Igarashi et al. |
| 6,727,685 B2 | | 4/2004 | Kojima |
| 6,742,144 B2 | | 5/2004 | Co |
| 6,882,141 B2 | * | 4/2005 | Kim .................... 324/750.05 |
| 7,014,033 B2 | | 3/2006 | Sticht et al. |
| 7,279,915 B2 | | 10/2007 | Cram |
| 7,312,620 B2 | | 12/2007 | Lopez et al. |
| 7,884,631 B2 | * | 2/2011 | Co et al. .................... 324/757.01 |
| 2002/0011836 A1 | | 1/2002 | Ito et al. |
| 2002/0036161 A1 | | 3/2002 | Nemoto et al. |
| 2002/0063557 A1 | | 5/2002 | Uchino et al. |
| 2003/0006793 A1 | | 1/2003 | Tverdy et al. |
| 2003/0226739 A1 | | 12/2003 | Goussev |
| 2004/0070416 A1 | | 4/2004 | Saito et al. |
| 2004/0078698 A1 | | 4/2004 | Co et al. |
| 2006/0119347 A1 | | 6/2006 | Shimada et al. |
| 2006/0181265 A1 | | 8/2006 | Saito |
| 2007/0069752 A1 | | 3/2007 | Ito et al. |
| 2007/0152655 A1 | | 7/2007 | Ham et al. |
| 2008/0252322 A1 | | 10/2008 | Hopkins et al. |
| 2008/0267761 A1 | | 10/2008 | Ward et al. |

* cited by examiner

*Primary Examiner* — Ha Tran T Nguyen
*Assistant Examiner* — Arleen M Vazquez
(74) *Attorney, Agent, or Firm* — Stuart T. Auvinen; gPatent LLC

(57) ABSTRACT

A conveyor-stack test system has motherboards that test memory modules. The motherboards are not stationary but are placed inside movable trays that move along conveyors. A loader-unloader removes tested memory modules from test sockets on the motherboards and inserts untested memory modules into the motherboards using a robotic arm. A conveyor carries the motherboards from the loader-unloader to an elevator. The elevator raises or lowers the motherboards to different levels in a conveyor stack with multiple levels of conveyors each with many test stations. The motherboards move along conveyors in the conveyor stack until reaching test stations. A retractable connector from the test station extends to make contact with a motherboard connector to power up the motherboard, which then tests the memory modules. Test results are communicated from the test station to a host controller, which instructs the loader-unloader to sort the tested memory modules once the motherboard returns.

20 Claims, 11 Drawing Sheets

TOP VIEW

SIDE VIEW

SIDE VIEW

SIDE VIEW

TOP VIEW

TOP VIEW

SIDE VIEW

CONVEYOR-BASED MEMORY-MODULE TESTER WITH ELEVATORS DISTRIBUTING MOVING TEST MOTHERBOARDS AMONG PARALLEL CONVEYORS FOR TESTING

FIELD OF THE INVENTION

This invention relates to electronic-test systems, and more particularly to robotic testers with movable test motherboards for testing memory modules including SIMMs and DIMMs.

BACKGROUND OF THE INVENTION

Memory is a fundamental part of many digital electronic systems. A variety of electronic systems including personal computers (PCs) use DRAM memory chips mounted on small, removable memory modules. Older single-inline memory modules (SIMMs) have been replaced with dual-inline memory modules (DIMMs), and 184-pin RIMMs (Rambus inline memory modules) and 184-pin DDR (double data rate) DIMMs. New kinds of memory modules continue to be introduced.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Handlers for integrated circuits (ICs) have been used for many years in the semiconductor industry. Handlers accept a stack of IC chips that are fed, one at a time, to the tester. The tested IC is then sorted into a "bin" for IC chips that have passed or failed the test. Handlers have also been developed for memory modules.

Rather than use an expensive general-purpose I.C. tester, inexpensive testers based on PC motherboards have been developed. These motherboard-based testers cost only about $10K while replacing a quarter-million-dollar I.C. tester. The memory module to be tested is inserted into a test socket on a test adapter board (daughter card) mounted on the back-side of the motherboard. Special handlers can be used for module insertion.

Elevated-temperature testing is often desired to more thoroughly screen for defects. Hot air can be blown onto the memory module being tested. Ideally, the motherboard itself is cooled while the memory module under test is heated. See U.S. Pat. No. 6,357,023 for "Connector Assembly for Testing Memory Modules from the Solder-Side of a PC Motherboard with Forced Hot Air".

FIG. 1 highlights a motherboard-based memory tester. A conventional PC motherboard is mounted upside-down within chassis 60. Rather than connect motherboard substrate 30 directly to chassis 60, as in a conventional PC, motherboard substrate 30 is mounted to metal plate 64 by standoffs or spacers 61. Motherboard substrate 30 is not mounted directly to chassis 60 in this embodiment, although it could be in some embodiments. Screws, bolts, or clamps (not shown) can be used to secure metal plate 64 to chassis 60.

Test adapter board 50 is mounted to well 66, while well 66 is mounted to metal plate 64. Test socket 51 is mounted to test adapter board 50, while pins 52 provide electrical connection from test socket 51 to motherboard substrate 30. The memory module 18 being tested is inserted into test socket 51. Test adaptor board 50 provides electrical connection from the module-under-test (MUT) in the SIMM/DIMM test socket 51 to the leads for the removed SIMM socket on the PC motherboard.

Motherboard substrate 30 has components 42, 44 (I.C. chips, sockets, capacitors, etc.) mounted on component-side 32 of substrate 30. Memory modules 36 are SIMM or DIMM modules that fit into SIMM/DIMM sockets 38. SIMM/DIMM sockets 38 (hereinafter SIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory module 18 into test socket 51 since cables 48 and expansion cards 46 are mounted below substrate 30, while test socket 51 is mounted above substrate 30. Cables 48 and expansion cards 46 are kept out of the way inside chassis 60.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has adapter pins 52 inserted in holes to make electrical contact. These adaptor pins are soldered into through-holes in adaptor board 50 and in substrate 30. Adapter pins 52 are arranged to have the same arrangement and spacing as the substrate-mounting pins for SIMM sockets 38. One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32.

Cooling fan 71 is provided in chassis 60 to cool motherboard substrate 30 and its components 42, 44 and expansion cards 46. Even air at room temperature can be effective at cooling the motherboard if a sufficient volume of air is blown past the motherboard's components. Components such as integrated circuits heat up during operation and benefit from such cooling. Of course, reduced-temperature air could also be blown into chassis 60, such as air from outside a building in a cold climate.

Since metal plate 64 separates motherboard substrate 30 from test adapter board 50, the cooling air from cooling fan 71 is separated from any heated air blown against memory module 18 under test. Test adapter board 50 is mounted within well 66 and forms a sufficient seal to prevent the cooling air within chassis 60 from cooling memory module 18 being heated and tested.

FIG. 2 is an overhead diagram looking down on a multi-motherboard test station with overhead rails for an x-y-z robotic handler. See "Automated Multi-PC-Motherboard Memory-Module Test System with Robotic Handler and In-Transit Visual Inspection", U.S. Pat. No. 6,415,397. Operator 100 can sit in front of the test station, controlling operation with a touch-screen or keyboard. Trays of untested memory modules can include a barcode that is scanned in to main system interface 65 by operator 100 before the tray is put into input stacker 63. Robotic handler 80 then picks untested modules that are moved over to input tray 62 by stacker 63. The modules are first inserted into leakage tester 82. Modules that pass are then moved by robotic handler 80 to the test socket on the test adaptor board on the solder-side of one of motherboard substrates 30 for testing.

Modules that fail the motherboard or leakage test are placed on repair tray 76 by robotic handler 80. Modules passing the motherboard test are pulled from the test socket by robotic handler 80 and moved in front of cameras 75 for visual inspection. Modules failing visual inspection are dropped into VI tray 78. Passing modules are placed on output tray 72 and full trays are moved by stacker 73 to the front of the test station where operator 100 can remove them.

Each of the motherboards fits into a well in the frame of the test station. The test station has a surface at about bench-top level composed of the exposed solder sides of the motherboards in the wells in the frame. Robotic handler 80 rides on rails 92, 94 mounted above the level of the motherboards, such as above the head of a seated operator 100. Operator 100 also replaces repair tray 76 and VI tray 78 with empty trays when full.

Fixed rails 92, 94 in the x direction allow movable y-rail 96 to travel in the x direction. Robot arm assembly 98 then travels in the y direction along y-rail 96 until robot arm assembly 98 is directly over the desired position, such as a test socket on an adaptor board, or an input or output tray. An elevator arm on robot arm assembly 98 then moves up and down, pulling out (up) a module or inserting a module into (down) a test socket or tray. Robot arm assembly 98 can also rotate or spin the module into the desired position.

While such motherboard-based testers are useful, higher-density testers are desired that have more motherboards in a smaller amount of floor area in a manufacturing facility. While these test systems use low-cost motherboards, the motherboards are fixed in location and are stationary. The robotic arm of robotic handler 80 of FIG. 2 must have a long travel distance to reach all motherboards on the test system of FIG. 2. This increases the cost of the robotic handler. The fixed number of motherboards 30 that can be reached by robotic handler 80 limits the number of memory modules that can be tested at one time by the test system.

What is desired is a larger test system. A test system that tests memory modules on motherboards is desirable to reduce cost. It is further desired to test memory modules using more motherboards than can be reached by the robotic arm.

It is desired to move motherboards using a conveyor and/or elevator system so that motherboards may perform testing when moved away from robotic handlers, thus increasing the number of motherboards that may be serviced by a robotic handler. It is desired to load and unload memory modules from motherboards when these motherboards are moved near the robotic handler, but perform testing when these motherboards are moved away from the robotic handler. Thus a smaller robotic handler may be used with a large number of movable motherboards.

DETAILED DESCRIPTION

The present invention relates to an improvement in motherboard-based test systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that robotic test systems are limited by the number of motherboards that can be reached by a robotic arm. The high cost of the robotic arm that inserts and removes memory modules from the motherboards increases tester and testing costs.

The inventor has further realized that the motherboards do not have to be within reach of the robotic arm while the motherboards are testing the memory modules. Some kinds of testing may require long periods of time, such as characterization and quality testing. During these long test periods, the motherboard may be moved away from the robotic arm, allowing other motherboards to be moved within range of the robotic arm. Thus one robotic arm may service many more motherboards than the few motherboards that would fit within the reach of the robotic arm. Testing throughput may be dramatically increased without increasing the cost of the robotic arm handler.

Conveyors may be used to move motherboards away from the robotic arm. The motherboards may be powered and perform testing at a remote test station reached by the conveyor. After testing is complete, the motherboards may be moved by the conveyor back to the robotic arm so that the tested memory modules may be removed and new untested memory modules inserted to begin the cycle anew.

Figure 1:
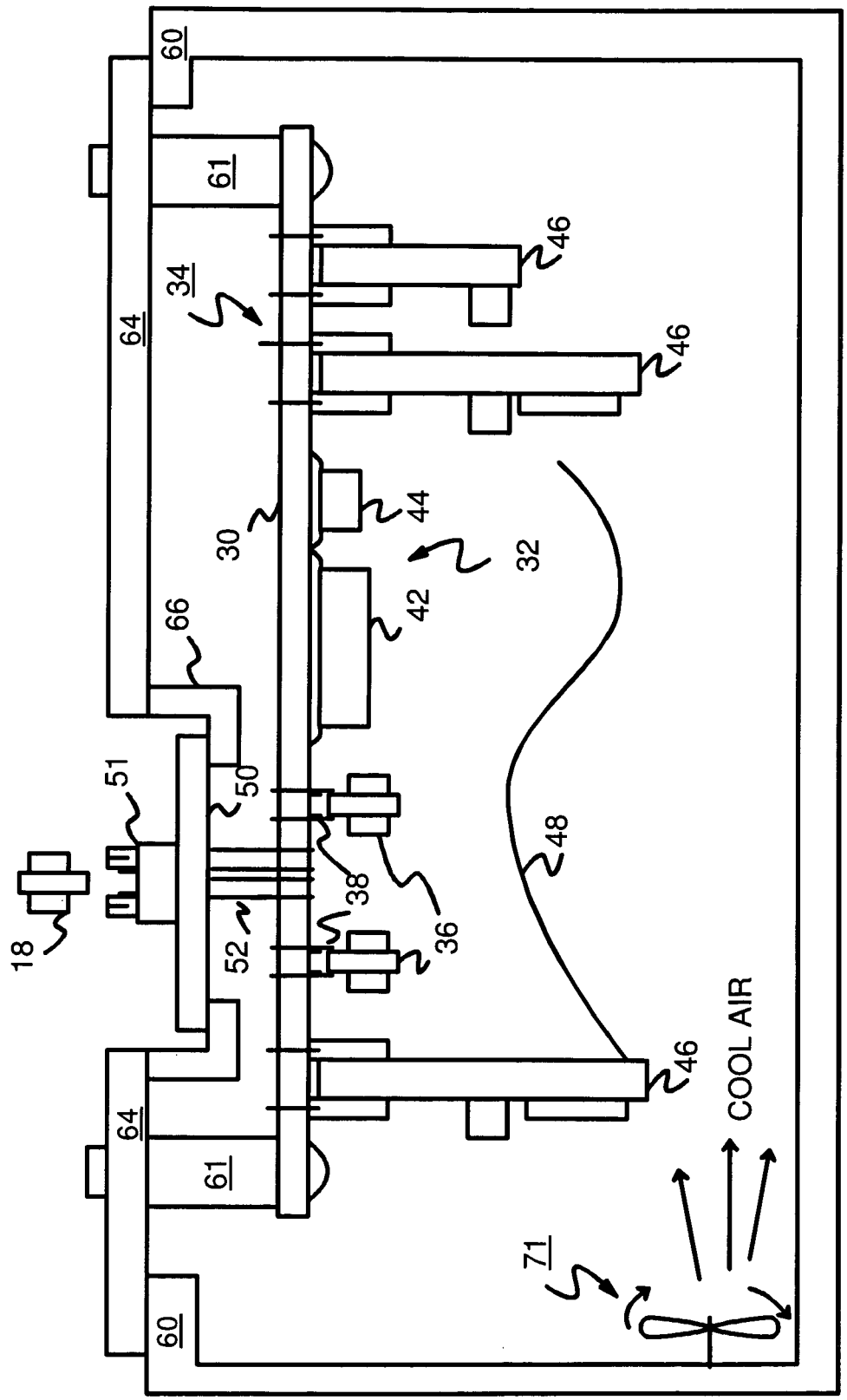
FIG. 1 highlights a motherboard-based memory tester.
Figure 2:
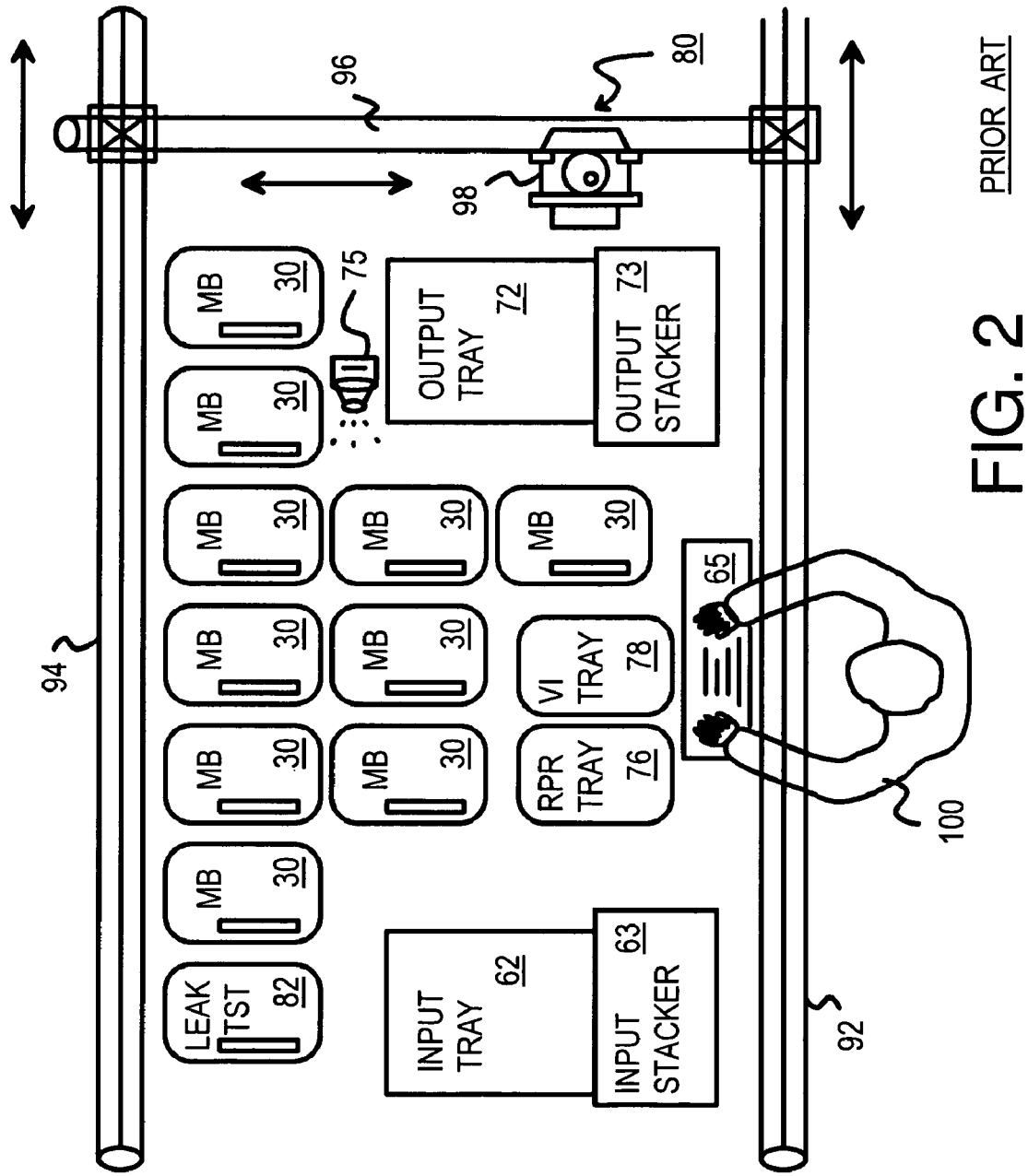
FIG. 2 is an overhead diagram looking down on a multi-motherboard test station with overhead rails for an x-y-z robotic handler.
Figure 3:
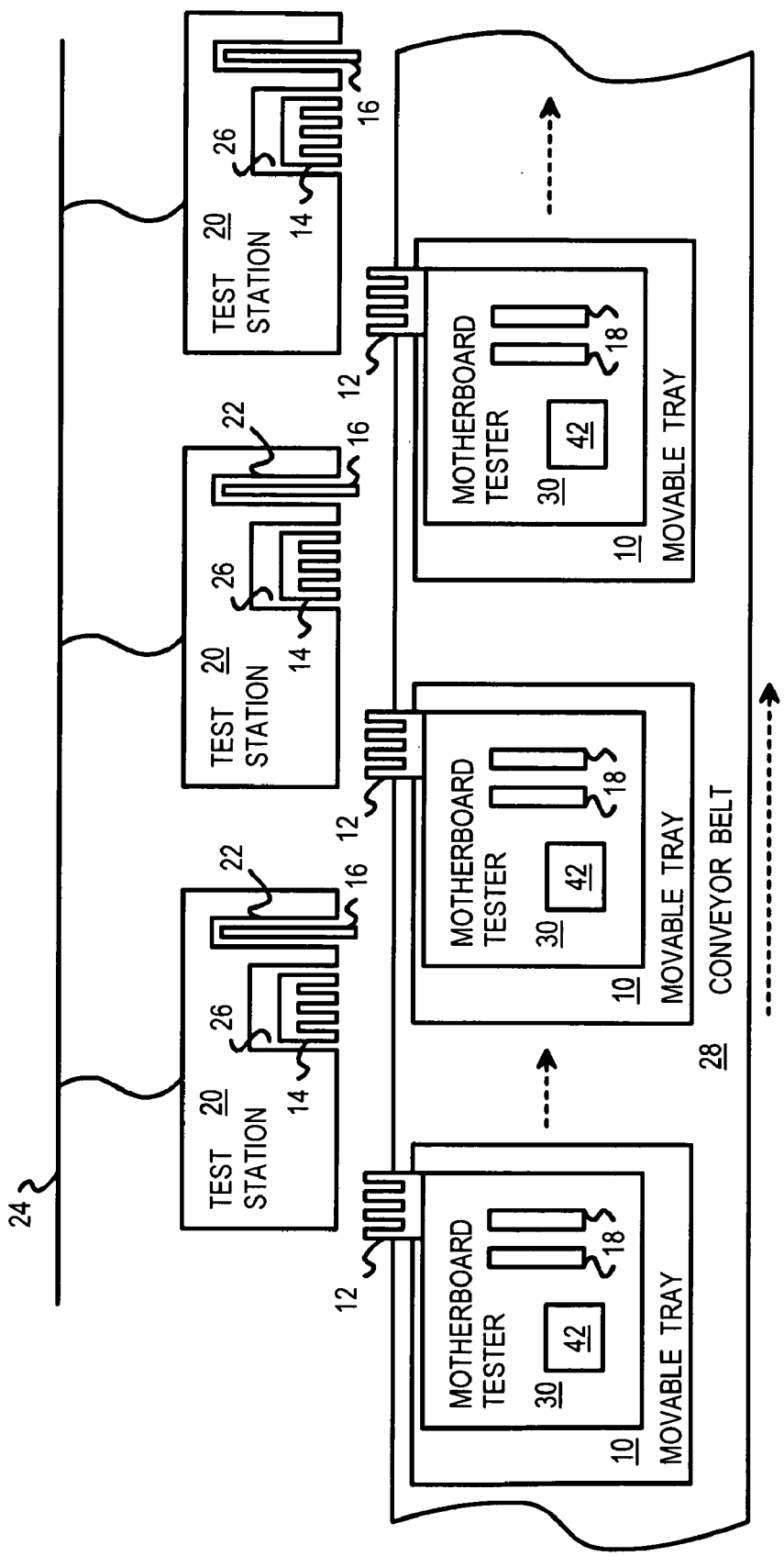
FIG. 3 shows motherboards being moved along a conveyor belt toward test stations.

FIG. 3 shows motherboards being moved along a conveyor belt toward test stations. Movable trays 10 have been placed on conveyor belt 28 and are moved along as conveyor belt 28 moves to the right. Each movable tray 10 holds one or more motherboard substrate 30, which is a PC motherboard with a microprocessor and other chips as components 42 that use memory modules 18 as the main memory of the motherboard. Memory modules 18 have earlier been inserted into test sockets on motherboard substrate 30.

Conveyor belt 28 has several test stations 20 located alongside. Each test station 20 has a retractable connector 14 that mates with motherboard connector 12 on motherboard substrate 30 to apply power to the motherboard. Test results generated by motherboard substrate 30 testing memory modules 18 are sent through connectors 12, 14 to test station 20, and then communicated over Ethernet 24 or another network bus to a host controller.

In FIG. 3, retractable connectors 14 are retracted into well 26 so that motherboard substrates 30 may pass by as conveyor belt 28 moves along. No contact is made between retractable connector 14 and motherboard connector 12 when retractable connector 14 is retracted into well 26.

Figure 4:
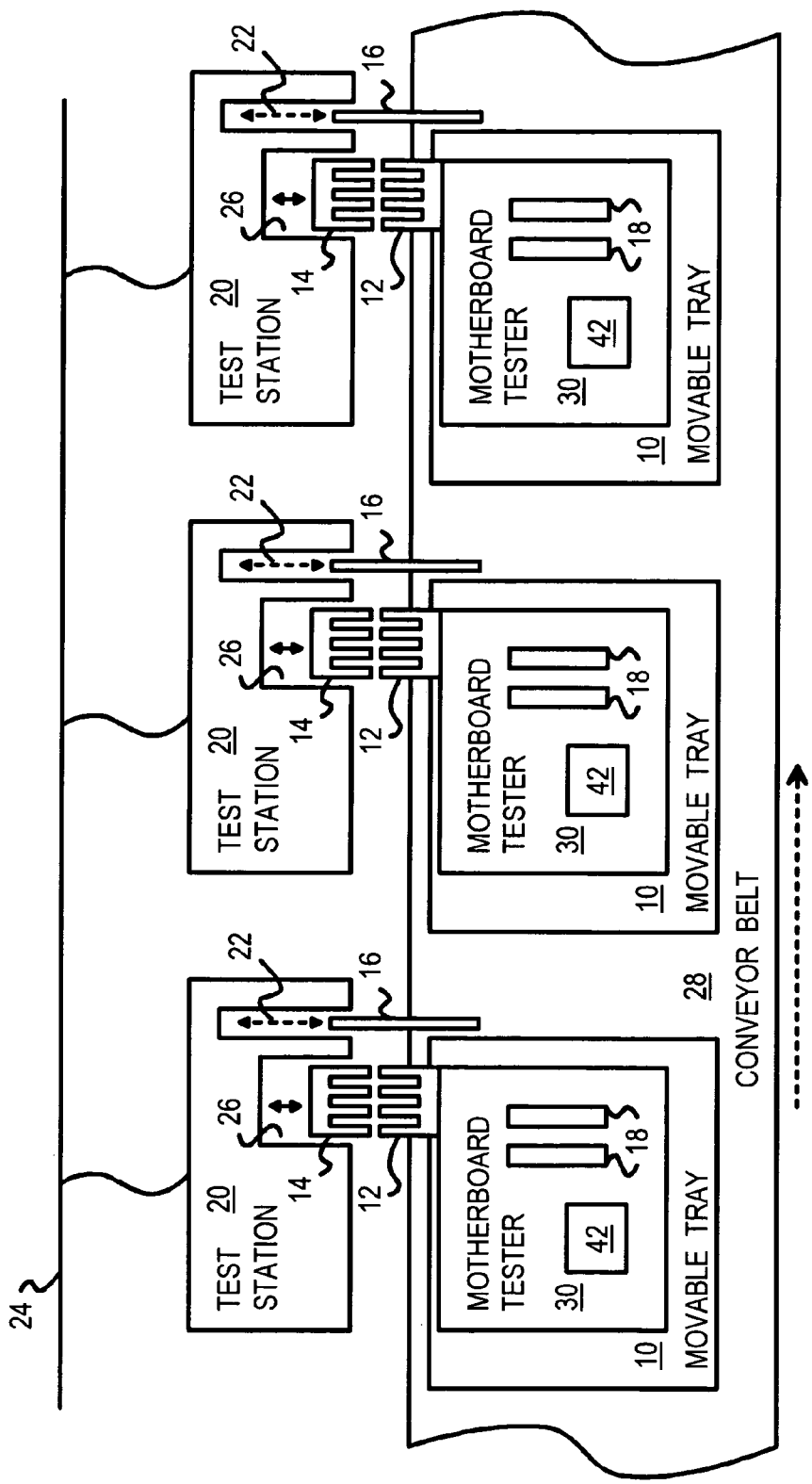
FIG. 4 shows motherboards on a conveyor belt that are connected to test stations to test memory modules on the motherboards.

FIG. 4 shows motherboards on a conveyor belt that are connected to test stations to test memory modules on the motherboards. Commands from a host controller are sent over Ethernet 24 to test stations 20, causing each test station 20 to extend its stopper 16 from stopper well 22. Stopper 16 extends over conveyor belt 28 and stops movable tray 10 as conveyor belt 28 moves it along. Stopper 16 helps to align movable tray 10 and motherboard substrate 30 near test station 20. An object sensor can also be placed on test station 20 to aid in the detection and alignment of movable tray 10.

Conveyor belt 28 may then be halted by the host controller, or it may continue to run if movable trays 10 can slip over conveyor belt 28 when held in place by stoppers 16. Alternately, wheels may be placed underneath movable tray 10 to prevent it from rolling while conveyor belt 28 is running. A solenoid, gears, or other mechanism may be used to move stopper 16 and retractable connector 14.

Once movable tray 10 and motherboard substrate 30 are aligned by stopper 16, the host controller may instruct test station 20 to extend retractable connector 14 from well 26. Retractable connector 14 then makes contact with motherboard connector 12. Power and ground connect from test station 20 to motherboard substrate 30, causing motherboard substrate 30 to power up and re-boot or otherwise initialize. During booting, the CPU on motherboard substrate 30 writes and reads to locations in memory modules 18, thus testing memory module 18. Further test programs may be executed by motherboard substrate 30 after booting. The results of these tests are reported back to test station 20 through motherboard connector 12 and retractable connector 14, and test station 20 reports the test results back to the host controller over Ethernet 24.

After testing, retractable connector 14 is again retracted into well 26, breaking the electrical connection to motherboard substrate 30. Stopper 16 is retracted into stopper well 22, and conveyor belt 28 is restarted, causing movable trays 10 to carry motherboard substrates 30 away from test stations 20. The host controller tracks motherboard substrate 30 as it moves over conveyor belt 28 and back to the robotic arm for removal of memory module 18.

Figure 5:
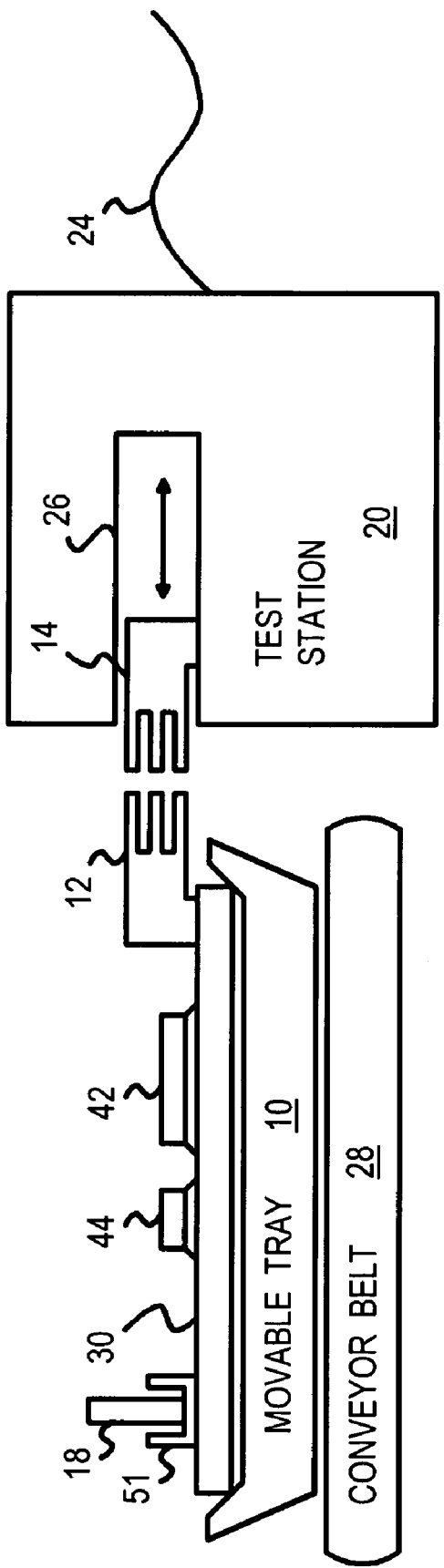
FIG. 5 is a side view of a test station.

FIG. 5 is a side view of a test station. FIGS. 3, 4 were top views and showed multiple test stations 20.

In the side view of FIG. 5, conveyor belt 28 moves movable tray 10 in a direction perpendicular to the plane of the drawing page. When retractable connector 14 is retracted into well 26, movable tray 10 is able to freely move past test station 20.

When stopper 16 is extended and movable tray 10 is aligned to test station 20, retractable connector 14 is extended from well 26 to make contact with motherboard connector 12. Test station 20 then applies power to motherboard substrate 30 through retractable connector 14 and motherboard connector 12, and components 42, 44 are activated, causing the microprocessor to boot and begin executing instructions in a boot routine stored in a ROM.

During this boot routine, memory addresses are generated and sent to memory module 18, which was earlier inserted into test socket 51 by a robotic arm. The boot routine writes and reads memory locations in memory module 18 to determine if memory module 18 is faulty or good. Additional test routines may be activated to more extensively test memory module 18, or power may be cycled on and off to motherboard substrate 30 to repeatedly test memory module 18, such as for burn-in testing.

After testing is complete, results may be detected by test station 20 over retractable connector 14 and sent to the host controller over Ethernet 24. Test station 20 retracts retractable connector 14 into well 26, and movable tray 10 may then be moved along conveyor belt 28, carrying motherboard substrate 30 away from test station 20 toward a loading/unloading station.

Test station 20 is out of the reach of the robotic arm. Motherboard substrate 30 must be carried by movable tray 10 along conveyor belt 28 to return to the loading station so that the robotic arm may remove memory module 18 from test socket 51.

Figure 6:
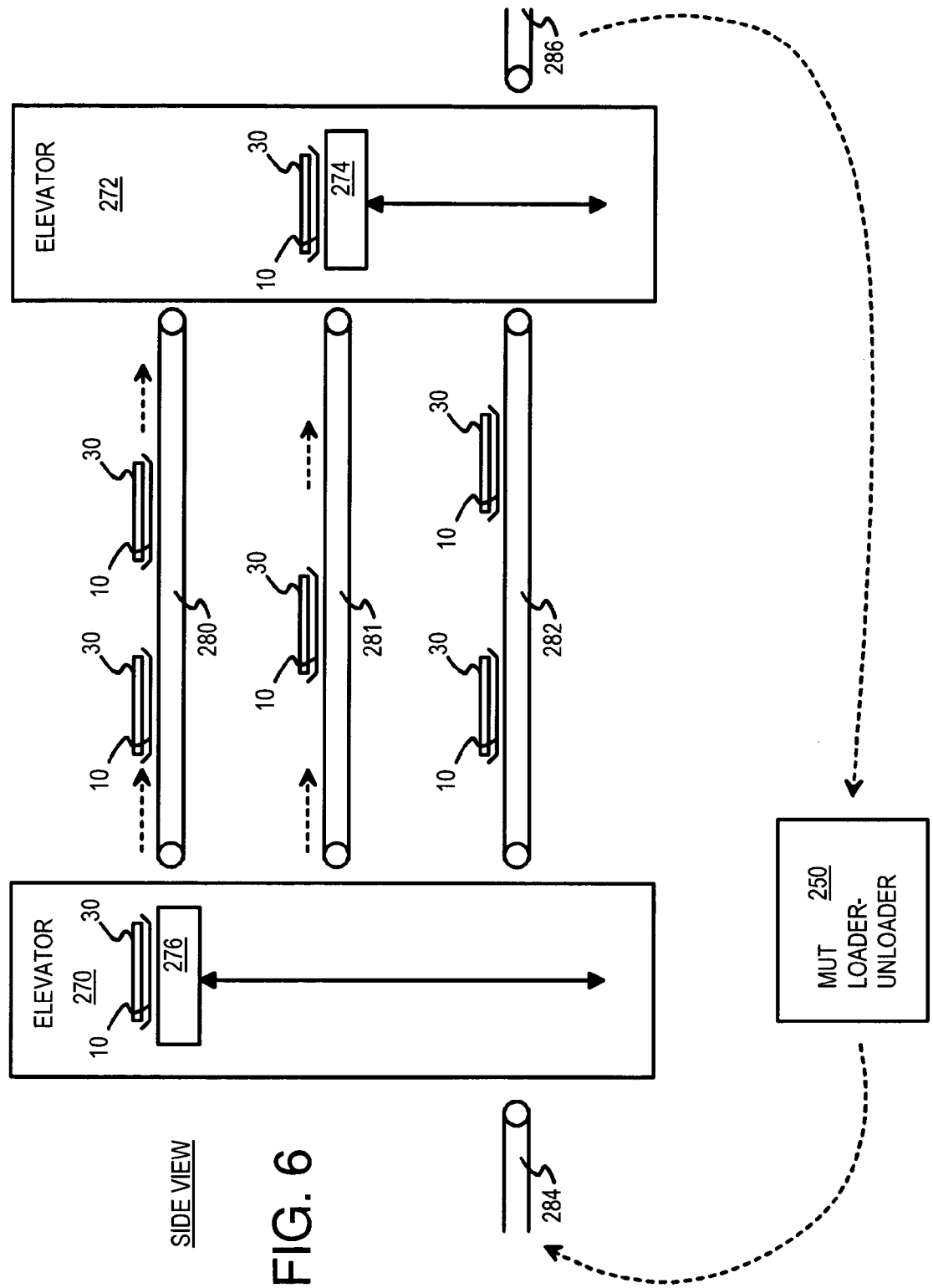
FIG. 6 shows a conveyor stack with elevators for moving motherboard-based testers.

FIG. 6 shows a conveyor stack with elevators for moving motherboard-based testers. A robotic arm in module-under-test (MUT) loader-unloader 250 loads a new memory module into a motherboard for testing. The loaded motherboard is then moved by input conveyor 284 to input elevator 270.

The side view in FIG. 6 shows three levels of conveyor belts 280, 281, 282 that are stacked above one another, thus saving floor space. Each of conveyor belts 280, 281, 282 can be conveyor belt 28 shown in FIGS. 3-5, with several test stations 20 on each conveyor level. Thus many motherboard substrates 30 may be activated in parallel to test memory modules. For example, when there are 10 test stations 20 per level, and three levels of conveyor belts 280, 281, 282, a total of 30 motherboards may be testing memory modules at any particular time.

Elevators 270, 272 raise and lower motherboard substrate 30 on movable tray 10 on elevator tables 276, 274.

The untested memory modules in motherboard substrate 30 are moved by movable tray 10 from input conveyor 284 to input elevator 270, which lifts movable tray 10 and motherboard substrate 30 to one of the three levels of conveyor belts 280, 281, 282. At the selected level, input elevator 270 pushes movable tray 10 off of elevator table 267 and onto conveyor belt 280.

The memory modules inserted into motherboard substrates 30 are tested at test stations along conveyor belts 280, 281, 282. Once testing is completed, conveyor belts 280, 281, 282 carry the motherboards to output elevator 272. For example, motherboard substrate 30 on conveyor belt 281 finishes testing and is moved by conveyor belt 281 to output elevator 272. Conveyor belt 281 then forces movable tray 10 onto elevator table 274 in output elevator 272. Elevator table 272 is then lowered to the bottom level, where movable tray 10 is pushed off of elevator table 274 and onto output conveyor 286. Output conveyor 286 then moves movable tray 10 to MUT loader-unloader 250 which has a robotic arm that removes the tested memory modules from motherboard substrate 30 on movable tray 10. New memory modules can then be inserted into motherboard substrate 30 and the test conveyor cycle repeated.

Figure 7:
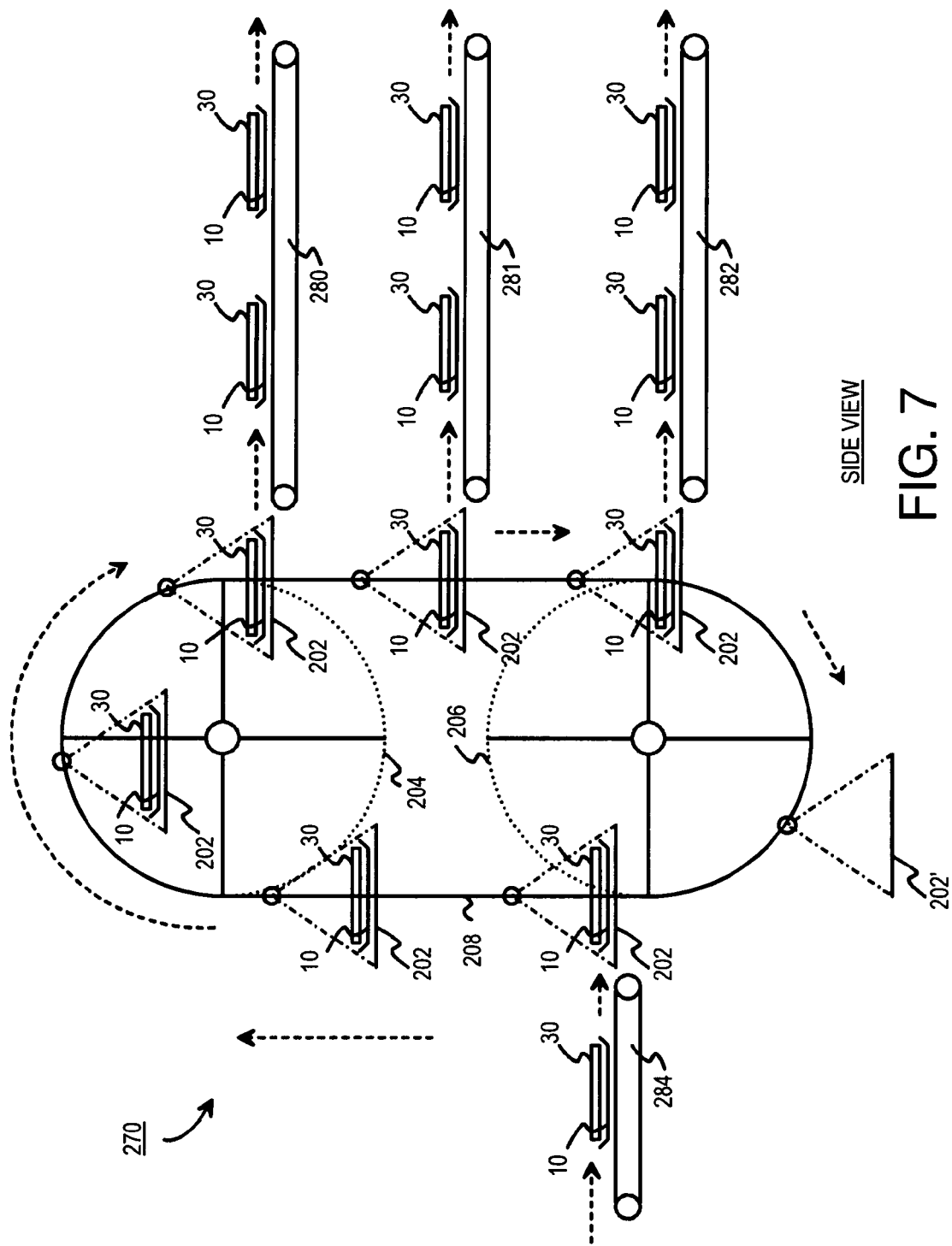
FIG. 7 is a diagram of a Ferris-wheel type of elevator.

FIG. 7 is a diagram of a Ferris-wheel type of elevator. Wheels 204, 206 rotate, causing chain 208 to rotate in a looping fashion. Chain 208 has several baskets 202 attached to it that can swing freely. Each basket 202 can hold one movable tray 10 with a motherboard substrate 30 in it.

When a basket 202 reaches the end of input conveyor 284, a movable tray 10 may be moved from input conveyor 284 onto basket 202. A loaded basked 202 may be unloaded when reaching one of conveyor belts 280, 281, 282. Empty baskets 202' are then returned to be reloaded from input conveyor 284. Wheels 204, 206 may be paused to allow loading and unloading of baskets 202. Activated rods may be used to push movable tray 10 on and off of baskets 202. A forklift-type mechanism may be used as well.

Figure 8:
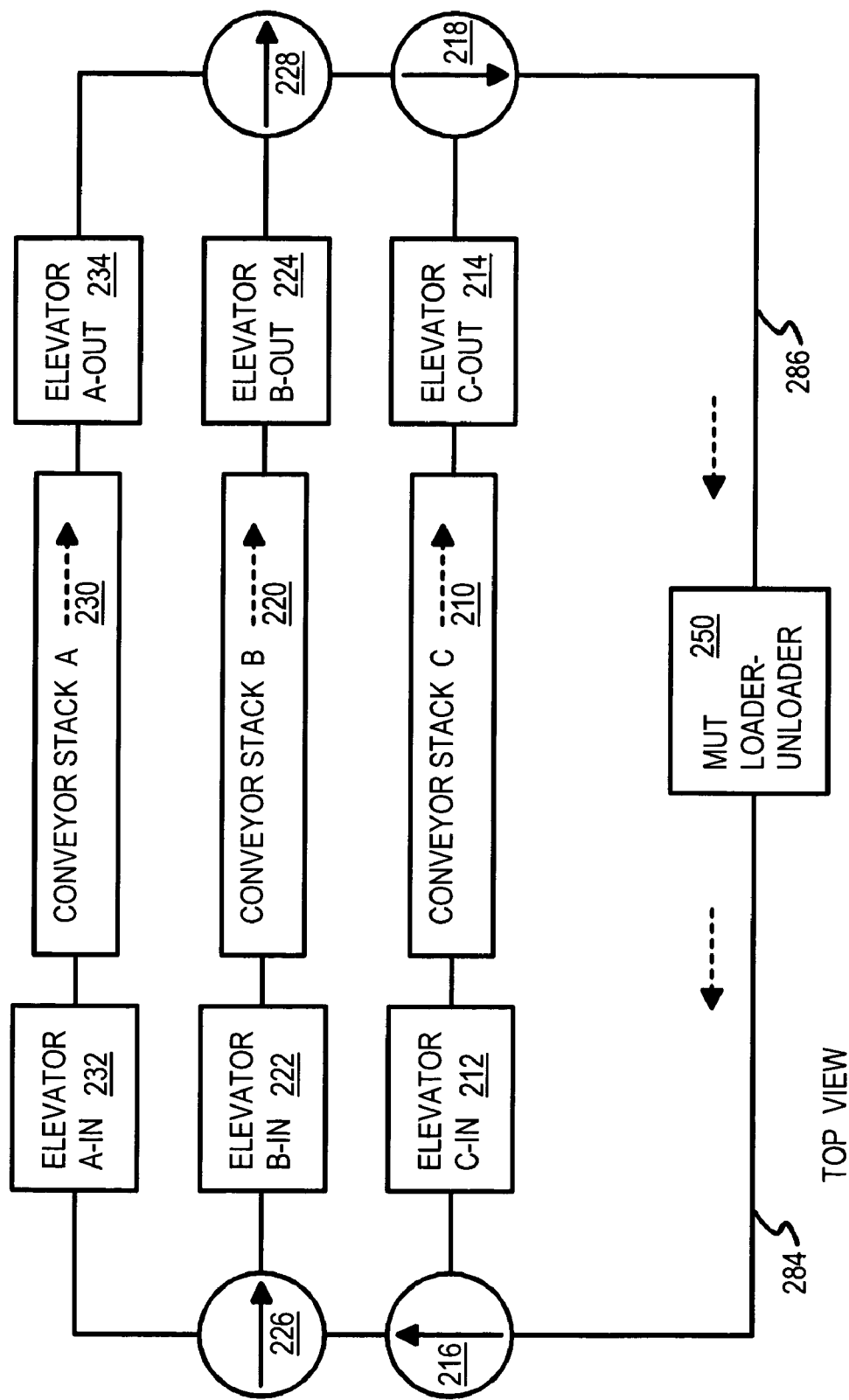
FIG. 8 shows parallel elevators and conveyor stacks.

FIG. 8 shows parallel elevators and conveyor stacks. Motherboards are loaded with memory modules by MUT loader-unloader 250 and sent over input conveyor 284. Rotator 216 can divert the motherboard and its movable tray 10 to elevator 212 for testing on one of several levels of conveyor stack 210. After testing on a test station on conveyor stack 210, the motherboard is moved to the output level by elevator 214 and selected by rotator 218 to return to MUT loader-unloader 250 over output conveyor 286.

Moving motherboards that are not diverted by rotator 216 are sent to rotator 226. Rotator 226 can divert the motherboard and its movable tray 10 to elevator 222 for testing on one of several levels of conveyor stack 220. After testing on a test station on conveyor stack 220, the motherboard is moved to the output level by elevator 224 and selected by rotators 228, 218 to return to MUT loader-unloader 250 over output conveyor 286.

Motherboards that are not diverted by rotators 216, 226 are sent to elevator 232 for testing on one of several levels of conveyor stack 230. After testing on a test station on conveyor stack 230, the motherboard is moved to the output level by elevator 234 and selected by rotators 228, 218 to return to MUT loader-unloader 250 over output conveyor 286.

Rotators 216, 226 can multiplex incoming motherboards to elevators 212, 222, 232, such as by loading one motherboard to each elevator in a round-robin sequence. This multiplexing allows for delays caused by elevators 212, 222, 232, or can allow for slower, less expensive elevators to be used.

Each of conveyor stacks 210, 220, 230 can have several levels of conveyor belts, such as shown in FIG. 6, and each conveyor belt can have several test stations as shown in FIG. 4. For example, when each of conveyor stacks 210, 220, 230 has 3 levels, and each conveyor belt has 10 test stations, a total of 90 motherboards may be testing memory modules at one time. This is ideal for slower test routines. A large number of motherboard-based testers are used, with only a single robotic arm in MUT loader-unloader 250. Thus the cost of the robotic arm is spread over a large number of inexpensive motherboards, reducing test costs.

Figure 9:
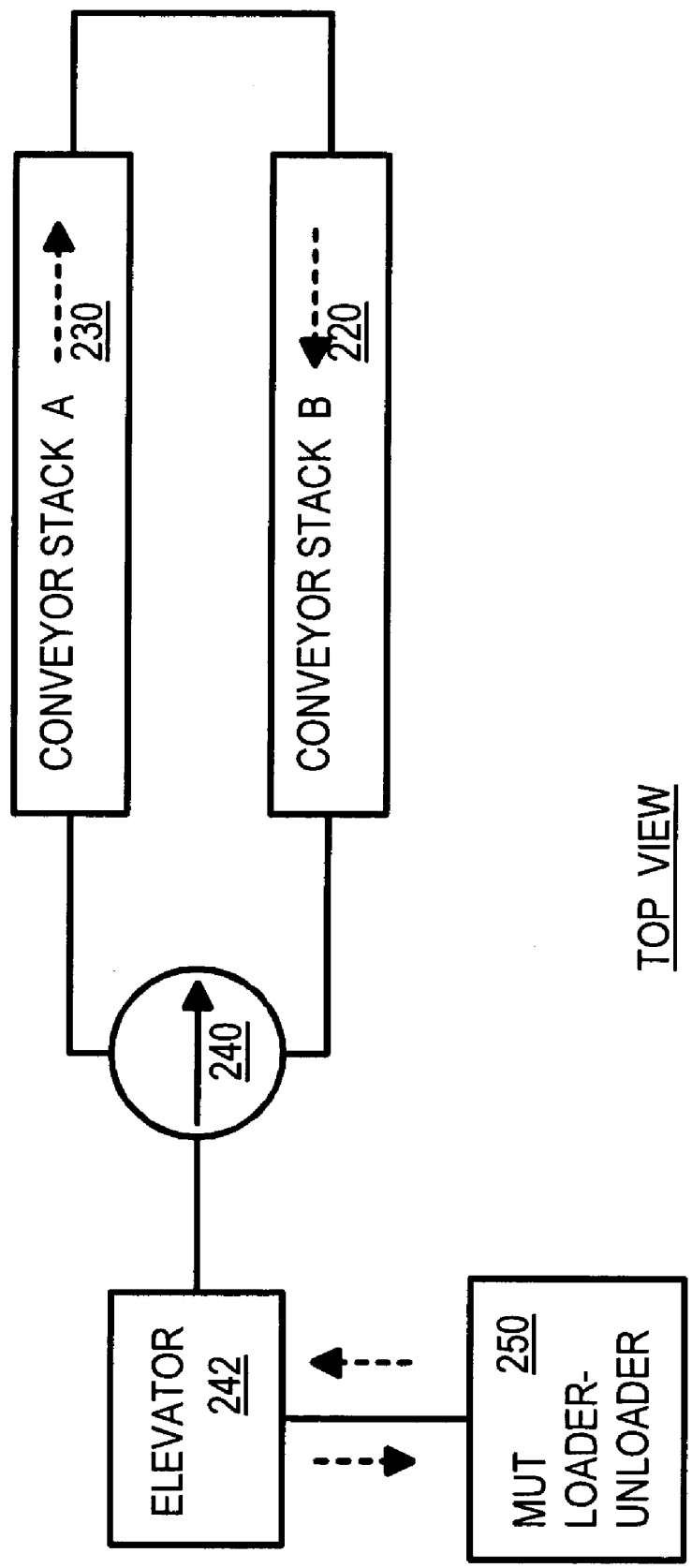
FIG. 9 shows a movable-motherboard-tester system using a single elevator.

FIG. 9 shows a movable-motherboard-tester system using a single elevator. MUT loader-unloader 250 sends fresh motherboards to elevator 242 and receives tested motherboards from elevator 242. A bi-directional conveyor or a pair of conveyors may be used between MUT loader-unloader 250 and elevator 242.

Conveyor stacks 230, 220 are connected together in a folded loop so that motherboards from conveyor stack 230 exit and pass through conveyor stack 220. Each level of conveyor stacks 230, 220 connect to a rotator 240 on that level. Rotator 240 sends untested motherboards from elevator 242 to conveyor stack 230, and receives tested motherboards from conveyor stack 220 and sends them to elevator 242 for return to MUT loader-unloader 250.

Since there is only one elevator 242, the test system cost may be reduced when elevators are expensive. Rotator 240 may be a simple diverter mechanism that may be less expensive than elevator 242. Conveyor stacks 230, 220 may have several levels and many test stations. For example, a test system with 3 levels and 20 test stations per level can test 60 motherboards at a time using only one elevator and one robotic arm.

A pair of elevators, or an elevator with an elevator table that can hold two motherboards may be used for elevator 242. Then rotator 240 may be deleted.

Figure 10:
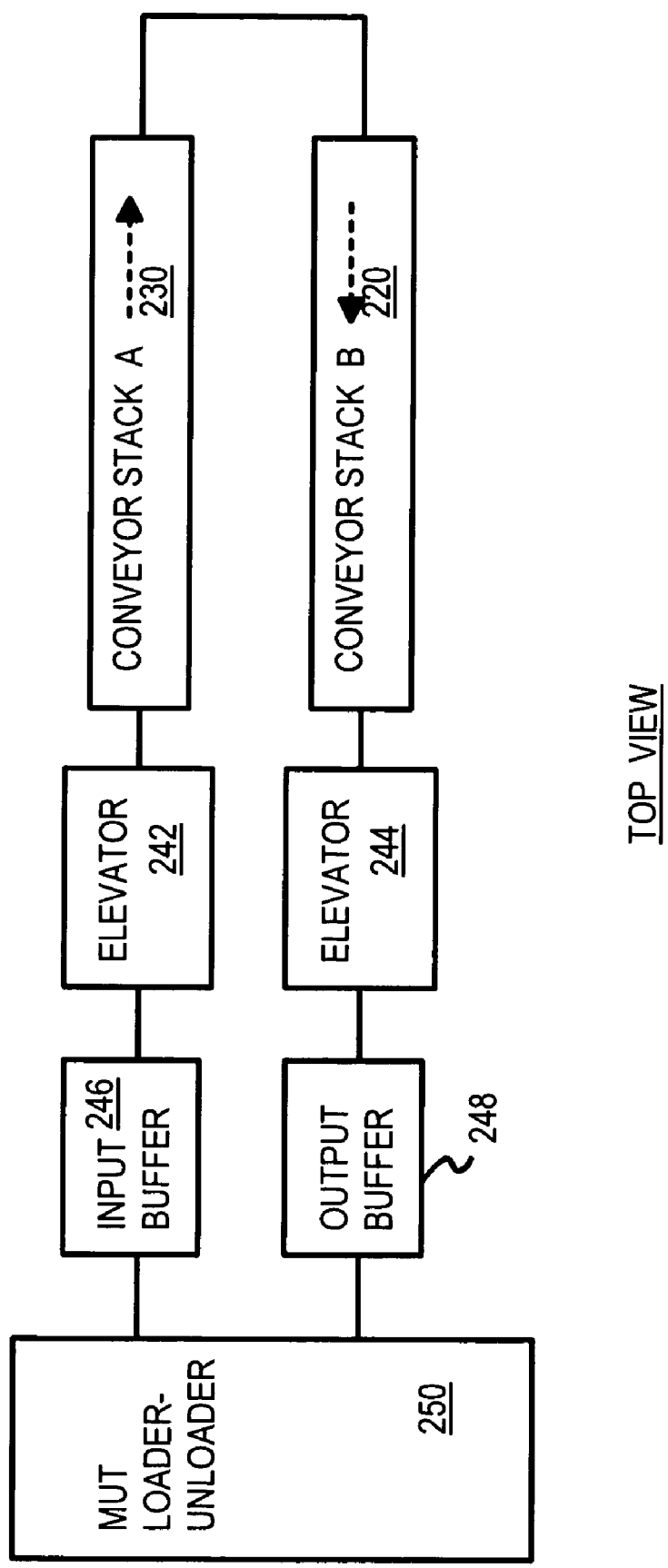
FIG. 10 shows a test system with two elevators and buffers with stacks of conveyors with test stations for testing memory modules using movable motherboards.

FIG. 10 shows a test system with two elevators and buffers with stacks of conveyors with test stations for testing memory modules using movable motherboards. Input buffer 246 buffers motherboards from MUT loader-unloader 250 before reaching elevator 242, while output buffer 248 buffers tested motherboards from elevator 244 before reaching MUT loader-unloader 250. Buffers 246, 248 can be implemented as additional conveyors that can hold a variable number of motherboards. The elevator wait delay may be reduced using buffers or other queues.

Figure 11:
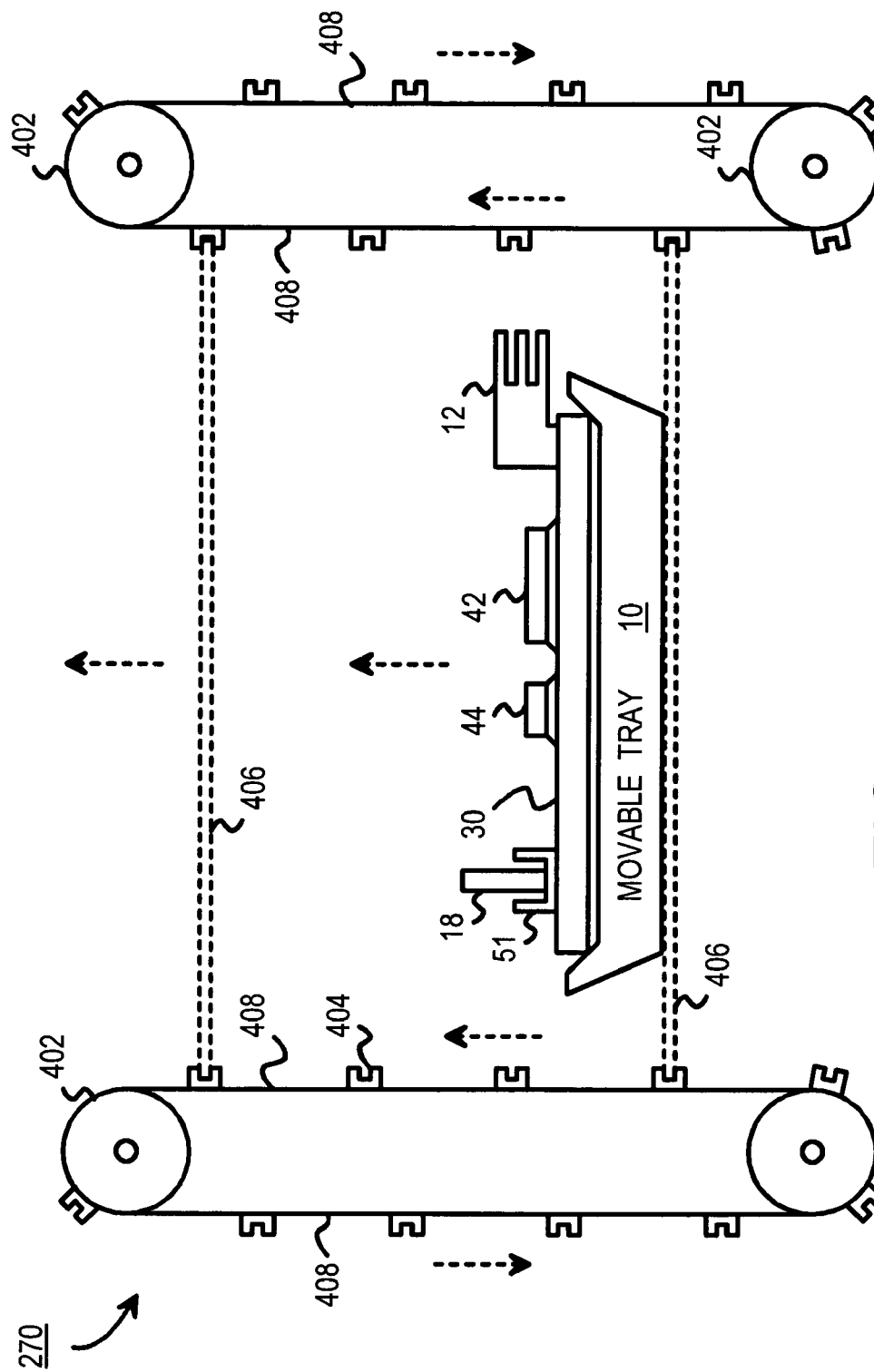
FIG. 11 is an alternate embodiment of an elevator that raises and lowers movable motherboard-based testers.

FIG. 11 is an alternate embodiment of an elevator that raises and lowers movable motherboard-based testers. Wheels 402 rotate to cause belts 408 to rotate in opposite directions. The left belt 408 rotates in a counter-clockwise fashion, while the right belt 408 rotates in a clockwise fashion.

Belts 408 have brackets 404 attached to them. Brackets 404 support elevator tables 406, which are inserted at the bottom and removed at the top. Movable tray 10 can be moved onto elevator table 406 and lifted into the desired level before being removed. Table 406 does not need to physically exist in some embodiments. For example, brackets 404 can be extended to support tray 10. Alternately, table 406 can be made part of tray 10, such as by a side protrusion from tray 10 for insertion into bracket 404.

Since this elevator moves in only one direction, a pair of elevators may be used as shown in FIG. 6, Alternately, wheels 402 may be rotated in a reverse direction to lower movable tray 10.

Alternate Embodiments

Several other embodiments are contemplated by the inventors. While conveyor belts have been described, conveyors may not use belts, but may use rollers, escalators, or other types of conveying apparatus for moving objects. Elevators 242, 244 (FIG. 10) could be a single elevator with a larger elevator table that could hold two movable trays 10 at a time. Hydraulics could be used to raise or lower the elevator table, or a cable or chain driven by a motor as in a conventional elevator.

Movable tray 10 could hold only 1 motherboard, or could hold more than 1 motherboard. Different sizes and form factors of the motherboards could be supported by movable tray 10. Also, movable tray 10 could be fixately attached to the motherboard or could integrated with motherboard, or the motherboard could be freely positioned in movable tray 10. The motherboard might have a tray attached to it, or a carrier of some sort that prevents the motherboard from shoring to any metallic parts of the conveyor system. Movable tray 10 can be made from an insulating material to prevent shorting of the motherboard to the conveyor. The conveyor system can be a standard conveyor such as used for moving boxes or other items, or may be more specialized. Such conveyer systems may include turns, bends, rotates, branching, lifts, etc.

Additional buffers, rotators, elevators, or other components could be added at various locations. The number of levels in a conveyor stack may vary, and the number of parallel conveyor stacks may also vary. While testing memory modules has been described, other components could be tested as the MUT. Hot or cold air could be applied to the MUT while the motherboard is stationary at test station 20. MUT's could also be pre-heated at an earlier station on the conveyor.

Input conveyor 284 and output conveyor 286 could be connected to the elevators at any level, rather than at the lowest level. Connection to a middle level could reduce elevator delay.

Multiple input conveyors 284 and output conveyors 286 could be used, perhaps with multiple MUT loader-unloader 250. Rather than have a single robotic arm, MUT loader-unloader 250 could have two or more robotic arms. Each robotic arm could pick and place one or more memory modules.

Local heaters could be mounted on the motherboard substrate or on test station 20. Radiant heat sources could be used or a resistive element. Radiant elements could directly heat the memory module.

Many kinds of memory modules can be tested. Modules using standard DRAM or newer EDO and synchronous DRAM can be tested. The system is ideally suited for testing the highest-speed memory modules, since capacitive loading is minimized. Other memories such as RAMBUS modules, DDR modules, and PC133 synchronous modules can be tested. Other kinds of electronic devices could be tested, such as SD memory cards, USB flash drives, and solid-state hard drives. Testers are not limited to motherboard-based testers, and include testers that can be placed on a conveyor.

Various sizes of memory in the memory module, and form factors for memory modules can be used with the invention, limited by the test adaptor board and well size. Different kinds of test adaptor boards can be substituted. The reverse-mounting of the test adaptor boards and the solder-side up arrangement of the test station allows a technician or operator to easily replace the test adaptor boards when necessary. The test adapter board can also be mounted to the motherboard in a substantially perpendicular orientation. See for example, U.S. patent application Ser. No. 10/249,841, "Robotic Memory-Module Tester Using Adapter Cards for Vertically Mounting PC Motherboards", now U.S. Pat. No. 7,509,532. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

A Yamaichi type connector could be used as the test socket, as motherboard connector 12, or as retractable connector 14. A production-quality connector/socket is preferred due to the low insertion force required. A production quality connector/socket can take more insertions (greater than 100,000 times) than conventional sockets on motherboards (rated for 100 insertions). A production socket may also have an ejector normally located at the edges of the socket. This alleviates the ejection of modules for manual as well as robotic handling. A production socket may also contain a V-shape groove. A handler or a robotic arm can drop the module to the V-shape entry, let it settle, and then push the module from the top to the socket. The V shape entry can lower the accuracy requirement to the handler or robotic arm for insertion of the module. Motherboard connector 12 and retractable connector 14 could also employ self-alignment or positioners.

A variety of technologies can be used for the robotic arm. A swinging or pivoting arm can be used, with perhaps a telescoping arm extension and a vertical servo at the end of the arm. Alternately, an x-y-z track system can be used. Many variations of automatic tray stacker or elevator systems are known and can be employed. The test program can initially pause after insertion of a new memory module to allow it to be warmed up by hot air. Memory modules could also be preheated by blowing hot air onto modules waiting to be inserted and tested. The input tray could be heated to accomplish this.

Many kinds of robotic arms and tracking systems can be employed, with different degrees of motion. Different grasping technologies can be used to hold the memory modules in the robotic arm. Multiple robotic arms that operate in tandem or independently can be used with MUT loader-unloader 250. For example, one arm can load modules into the motherboards, while a second arm unloads tested modules.

One operator may be able to operate several test stations, depending on how quickly trays need to be inserted and removed. Multiple arms can be attached to robot arm assembly 98, allowing 2 or more memory modules to be picked up and moved at the same time. The test adaptor boards can be modified to have two or more test sockets, allowing two or more modules to be tested at the same time with the same motherboard. The motherboard can then report which of the 2 modules has failed to the host controller or main system interface.

A network controller card on the ISA or PCI bus that communicates with the main system interface can be adapted for other buses and is not limited to existing buses. The controller card can be replaced by a standard parallel or serial-port interface to the main system interface. FireWire, USB, Ethernet, or other emerging standards can be used for the interfaces.

Of course, cold air rather than hot air could be blown onto the memory module. This might be useful for characterizing modules rather than for guard-band testing. Humid hot air could be used for testing hermetic seals of memory chips on the memory module, and even hot and cold air cycling could be done for reliability testing. The air may be recycled and re-blown through the channel by a blower or other air-flow system.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A parallel test system for testing memory modules on movable motherboards comprising:

a plurality of motherboards, each motherboard in the plurality of motherboards being a main board for a computer using memory modules as a memory;

test sockets on the plurality of motherboards, the test sockets for receiving memory modules for testing;

a loader-unloader for inserting memory modules into test sockets on motherboards in the plurality of motherboards when the motherboards are at a loading station;

a plurality of test stations, for connecting to motherboards in the plurality of motherboards and for activating the motherboards to test the memory modules inserted into the test sockets on the motherboards; and a conveyor for moving the plurality of motherboards from the loading station to the plurality of test stations, and for moving the plurality of motherboards from the plurality of test stations to the loading station after testing by the plurality of test stations, whereby the memory modules are inserted into motherboards that are moved by the conveyor to the plurality of test stations for testing, and wherein the conveyor moves motherboards back to the loading station after testing.

2. The parallel test system of claim 1 further comprising:

movable trays that are placed on the conveyor, each movable tray for holding a motherboard in the plurality of motherboards, each movable tray moving along the conveyor to transport the motherboard from the loading station to a test station in the plurality of test stations, and to return the motherboard to the loading station after testing.

3. The parallel test system of claim 2 wherein the movable trays electrically insulate the plurality of motherboards from the conveyor during testing by the plurality of test stations.

4. The parallel test system of claim 1 further comprising:

test adaptor boards, each coupled to a motherboard in the plurality of motherboards, the test adaptor boards having the test sockets for receiving memory modules for testing by the motherboards, each test adaptor board for electrically connecting a memory module inserted into the test socket to a motherboard attached to the test adaptor board, the motherboard using the memory module inserted into the test socket as a portion of the memory of the motherboard.

5. The parallel test system of claim 4 wherein the motherboards have a component side and a solder side, the component side having integrated circuits mounted thereon;

wherein the test adaptor boards are mounted to the solder side of the motherboards.

6. The parallel test system of claim 1 further comprising a main system interface, coupled to the plurality of test stations, for commanding test stations in the plurality of test stations to apply power to activate motherboards to test memory modules inserted into the test sockets and for receiving test results from the motherboards, wherein the main system interface instructs the loader-unloader to sort memory modules based on the test results;

wherein the main system interface stores the test results while the motherboard is being returned from the test station to the loader-unloader after testing by the test station.

7. The parallel test system of claim 6 wherein the loader-unloader further comprises:

a robotic arm, responsive to commands from the main system interface, for inserting memory modules into the test sockets on motherboards.

8. The parallel test system of claim 1 wherein the conveyor further comprises:

a conveyor stack having multiple levels of conveyor lines, wherein each conveyor line has a plurality of test stations;

an elevator for raising and lowering a motherboard to the multiple levels of conveyor lines; and an input conveyor line between the loading station and the elevator.

9. The parallel test system of claim 2 wherein the conveyor further comprises:

a plurality of conveyor stacks, each conveyor stack having multiple levels of conveyor lines, wherein each conveyor line has a plurality of test stations;

an elevator for raising and lowering a motherboard to the multiple levels of conveyor lines; and an input conveyor line between the loading station and the elevator.

10. The parallel test system of claim 9 further comprising a plurality of elevators each for raising and lowering a motherboard to the multiple levels of conveyor lines in a conveyor stack in the plurality of conveyor stacks; and a rotator for diverting a motherboard from the input conveyor line to a selected elevator in the plurality of elevators.

11. The parallel test system of claim 2 wherein each test station in the plurality of test stations further comprises:

a retractable connector for retracting to allow motherboards on the conveyor to pass by the test station, and for extending to make electrical contact with a motherboard connector on a motherboard.

12. The parallel test system of claim 11 wherein each test station in the plurality of test stations further comprises:

a stopper for extending over the conveyor to stop the motherboard from moving past the test station during testing, and for retracting to allow the motherboard to be moved by the conveyor after testing is completed.

13. A moving-motherboard memory-module tester comprising:

a plurality of motherboards for a personal computer, a motherboard in the plurality of motherboards for executing a test program to test a memory module inserted into a test socket on the motherboard;

a Module-Under-Test (MUT) loader-unloader having a robotic device that removes a tested memory module from the test socket on the motherboard, and that inserts a memory module into the test socket on the motherboard when the motherboard is located at the MUT loader-unloader;

an input conveyor that moves the motherboard away from the MUT loader-unloader after the memory module has been inserted into the test socket;

a input elevator that receives the motherboard from the input conveyor, and raises or lowers the motherboard to a selected level in a plurality of levels;

a conveyor stack having a plurality of levels, each level having a testing conveyor that receives motherboards from the input elevator;

a plurality of test stations along each testing conveyor, each test station having a retractable connector that connects to a motherboard connector on the motherboard, the retractable connector applying power to the motherboard to activate the motherboard to test the memory module in the test socket;

a network connection to the plurality of test stations for communicating test results from the plurality of test stations testing the plurality of motherboards, wherein the test results control the MUT loader-unloader to sort memory modules when the robotic device removes the tested memory modules, wherein test results indicating that the memory module failed testing are sorted into a failed group of memory modules while test results indicating that the memory module passed testing are sorted into a passing group of memory modules by the robotic device;

an output conveyor that moves the motherboard toward the MUT loader-unloader after the memory module has been tested by one of the plurality of test stations; and an output elevator that receives the motherboard from the testing conveyor for the selected level in the plurality of levels of the conveyor stack and lowers or raises the motherboard to a level of the output conveyor, whereby memory modules are transported from the MUT loader-unloader to the plurality of test stations by conveyors that move the plurality of motherboards between test stations and the MUT loader-unloader.

14. The moving-motherboard memory-module tester of claim 13 further comprising:

a plurality of movable trays that carry the plurality of motherboards along the input conveyor, the testing conveyor, and the output conveyor, whereby motherboards are carried by the plurality of movable trays.

15. The moving-motherboard memory-module tester of claim 14 further comprising:

a test adaptor board mounted to each motherboard, wherein the test socket is mounted on the test adaptor board, the test socket for receiving a memory module inserted by the robotic device.

16. The moving-motherboard memory-module tester of claim 14 wherein each testing conveyor passes along at least three test stations, wherein at least three motherboards are tested in parallel by each testing conveyor;

wherein the conveyor stack comprises at least three levels;

wherein the conveyor stack comprises at least three testing conveyors in a level;

wherein the conveyor stack tests at least nine motherboards in parallel.

17. The moving-motherboard memory-module tester of claim 16 wherein testing conveyors in a conveyor stack are located vertically above each other, whereby floor space is minimized.

18. The moving-motherboard memory-module tester of claim 13 wherein each test station further comprises:

a retractable connector that retracts to allow motherboards to pass by on the testing conveyor, and that extends to make contact with a motherboard connector on the motherboard;

wherein power is applied through the retractable connector and the motherboard connector by the test station when testing the memory module on the motherboard.

19. A multiple-motherboard conveying memory tester comprising:

host system means for controlling testing of memory modules on multiple motherboards and for controlling movement of motherboards by conveyors;

test socket means for receiving a memory module for testing;

conveyed motherboard means, controlled by the host system means, for executing a test program on a memory module inserted into the test socket means;

test adaptor board means, mounted on the conveyed motherboard means, for electrically connecting the test socket means to a memory bus means on the conveyed motherboard means;

wherein the multiple-motherboard conveying memory tester has a plurality of the conveyed motherboard means, each conveyed motherboard means having an attached test adaptor board means with a test socket means, each conveyed motherboard means for executing the test program on a different memory module in parallel with other motherboard means;

robotic means, controlled by the host system means, for grasping a memory module and inserting the memory module into the test socket means, the robotic means also for grasping and removing the memory module from the test socket means after completion of the test program, and moving the memory module to an output means for storing tested memory modules when the conveyed motherboard means indicates to the host system means that the memory module has passed the test program, test station means for applying power to the conveyed motherboard means to activate the conveyed motherboard means to test the memory module inserted into the test socket means; and conveying means, coupled between a loading station that is accessible by the robotic means, and a testing conveyor having a plurality of the test stations means, wherein the testing conveyor is not accessible by the robotic means, for moving the conveyed motherboard means from the loading station to the testing conveyor before testing, and for moving the conveyed motherboard means from the testing conveyor to the loading station after testing, whereby motherboards are moved from the loading station to the testing conveyor before testing, and moved from the testing conveyor back to the loading station after testing.

20. The multiple-motherboard conveying memory tester of claim 19 wherein the conveying means further comprises:

a plurality of levels, each level having a testing conveyor and a plurality of test station means; and elevator means for elevating the conveyed motherboard means to a selected level in the plurality of levels, whereby multiple levels of the test station means are accessed by the elevator means.

* * * * *